United States Patent
de Frésart et al.

(10) Patent No.: US 7,211,477 B2
(45) Date of Patent: May 1, 2007

(54) HIGH VOLTAGE FIELD EFFECT DEVICE AND METHOD

(75) Inventors: Edouard D. de Frésart, Tempe, AZ (US); Richard J. De Souza, Tempe, AZ (US); Xin Lin, Phoenix, AZ (US); Jennifer H. Morrison, Chandler, AZ (US); Patrice M. Parris, Phoenix, AZ (US); Moaniss Zitouni, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 137 days.

(21) Appl. No.: 11/124,469

(22) Filed: May 6, 2005

(65) Prior Publication Data

US 2006/0249751 A1    Nov. 9, 2006

(51) Int. Cl.
*H01L 21/336* (2006.01)
*H01L 21/8234* (2006.01)

(52) U.S. Cl. .................. 438/197; 438/223; 438/301
(58) Field of Classification Search ................ 438/197, 438/217, 223–224, 298, 230–231, 301
See application file for complete search history.

(56) References Cited

U.S. PATENT DOCUMENTS

| | | | |
|---|---|---|---|
| 4,300,150 A | 11/1981 | Kolak | |
| 4,422,089 A | 12/1983 | Vaes et al. | |
| 5,569,949 A | 10/1996 | Malhi | |
| 6,168,983 B1 | 1/2001 | Rumennik et al. | |
| 6,207,994 B1 | 3/2001 | Rumennik et al. | |
| 6,483,149 B1 | 11/2002 | Mosher et al. | |
| 6,501,139 B1* | 12/2002 | Petti | 257/408 |
| 6,639,276 B2* | 10/2003 | Spring et al. | 257/341 |
| 6,677,210 B1* | 1/2004 | Hebert | 438/301 |
| 6,713,813 B2 | 3/2004 | Marchant | |
| 2003/0183899 A1 | 10/2003 | de Fresart et al. | |
| 2003/0222329 A1 | 12/2003 | Fresart et al. | |
| 2004/0075144 A1 | 4/2004 | Zitouni et al. | |
| 2004/0097019 A1 | 5/2004 | de Fresart et al. | |

* cited by examiner

*Primary Examiner*—Hoai Pham
(74) *Attorney, Agent, or Firm*—Ingrassia Fisher & Lorenz

(57) ABSTRACT

Methods and apparatus are provided for a MOSFET (50, 99, 199) exhibiting increased source-drain breakdown voltage (BVdss). Source (S) (70) and drain (D) (76) are spaced apart by a channel (90) underlying a gate (84) and one or more carrier drift spaces (92, 92') serially located between the channel (90) and the source (70, 70') or drain (76, 76'). A buried region (96, 96') of the same conductivity type as the drift space (92, 92') and the source (70, 70') or drain (76, 76') is provided below the drift space (92, 92'), separated therefrom in depth by a narrow gap (94, 94') and ohmically coupled to the source (70, 70') or drain (76, 76'). Current flow (110) through the drift space produces a potential difference (Vt) across this gap (94, 94'). As the S-D voltage (Vo) and current (109, Io) increase, this difference (Vt) induces high field conduction between the drift space (92, 92') and the buried region (96, 96') and diverts part (112, It) of the S-D current (109, Io) through the buried region (96, 96') and away from the near surface portions of the drift space (92, 92') where breakdown generally occurs. Thus, BVdss is increased.

6 Claims, 4 Drawing Sheets

HIGH VOLTAGE FIELD EFFECT DEVICE AND METHOD

TECHNICAL FIELD

The present invention generally relates to the structure and fabrication of semiconductor devices and integrated circuits (ICs), and more particularly to providing high voltage MOSFET devices and integrated circuits.

BACKGROUND

Processing technologies and devices structures for forming integrated circuits (ICs) using metal-oxide-semiconductor-field-effect-transistors (MOSFETs) are well known in the art. It is understood that the term "MOSFET" is also used for device structures that employ other materials than simple oxide dielectrics and/or other conductors than simple metals. This is well known in the art. Accordingly, as used herein the term "MOSFET" is intended to include all such variations. Any type of semiconductor may be used.

Ordinarily, integrated circuit (IC) technologies and associated device structures are developed with specific performance goals in mind, as for example but not intended to be limiting, breakdown voltage, frequency response or speed, power consumption, critical dimensions, device packing density, achievable integration level, included device types and functions, etc. The development of a set of design rules, device types and associated manufacturing process flows that are capable of meeting the predetermined performance goals is a complex and expensive task. Once developed, transferring such a family of design rules and process flows to manufacturing is a further very large expense. Thus, there is an ongoing need for improvements that allow the performance capabilities of a particular technology to be extended without corresponding changes in the process capabilities or design rules. Stated another way, it is desirable to be able to achieve higher performance levels merely by altering the mask set designs (using the same design rules) while still using the available process technologies and/or flows already established in manufacturing. This has great economic benefit since it can allow an existing manufacturing technology to be extended to new classes of integrated circuit (IC) functions than had previously been possible, without a corresponding large investment in developing and installing new manufacturing technology.

Consider, for example, the case of an existing base manufacturing technology suitable for forming complex, dense, high speed, high performance system-on-a-chip (SOC) MOSFET integrated circuits. Suppose that the source-drain breakdown voltage (BVdss) rating of this base technology is, for example, Vbd-1 volts. While useful for many types of applications where this BVdss is sufficient, this base technology is not suitable for applications that require larger values of BVdss, that is (Vbd-2)=(Vbd-1)+Δ, where Δ is significant compared to (Vbd-1). Accordingly, it is desirable to be able to provide improved breakdown voltages. It is further desirable that such improved breakdown voltages are obtained without having to introduce any substantial change in the manufacturing technology. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
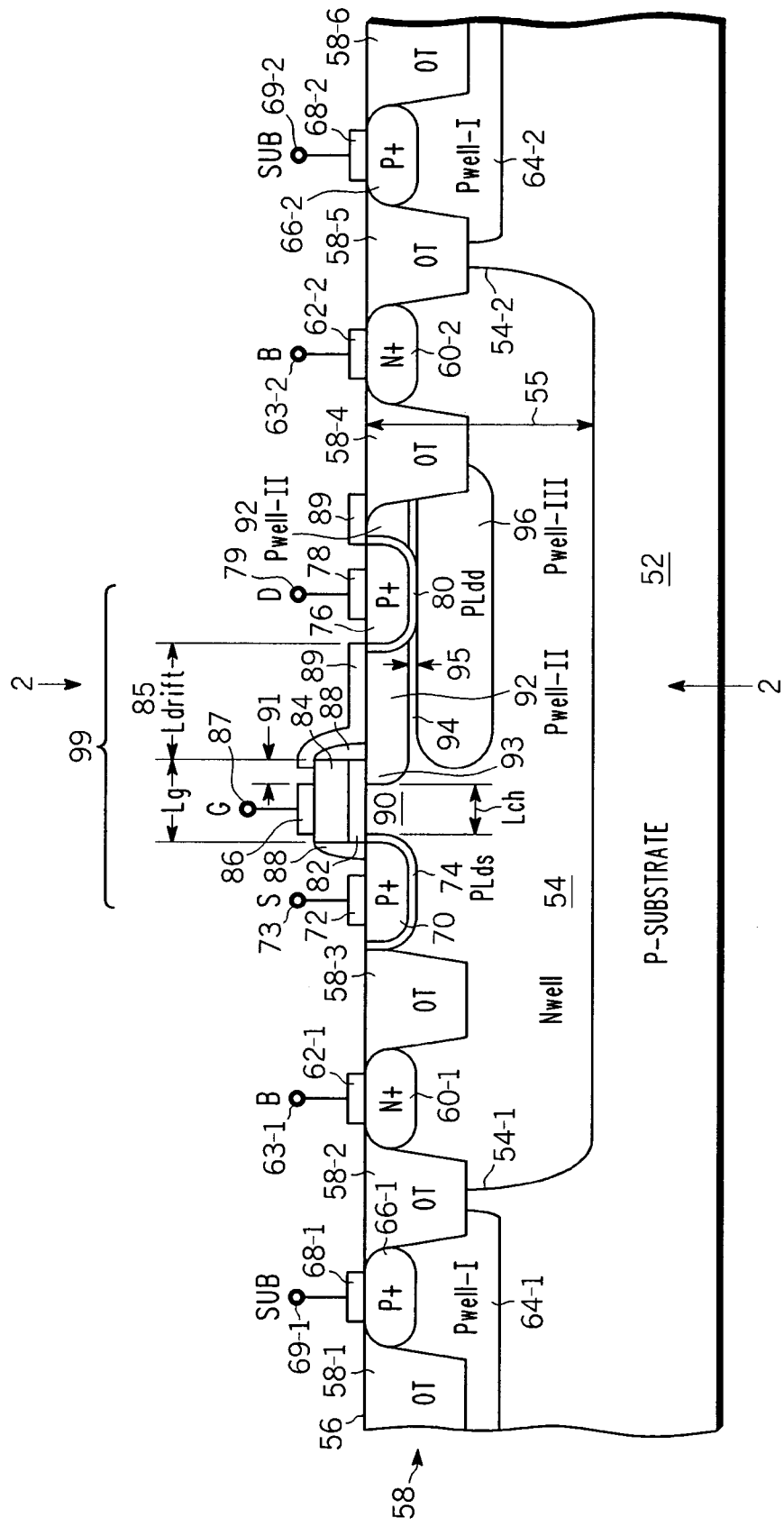
FIG. 1 is a simplified cross-sectional view though a MOSFET according to the present invention.

FIG. 1 is a simplified cross-sectional view though MOSFET 50 according to the present invention. MOSFET 50 comprises P-substrate 52, which serves as a foundation on which individual devices and a complex interconnected arrangement of many individual devices are fabricated to form an IC or SOC. Nwell region 54 is formed within substrate 52 extending distance 55 from upper or first surface 56 of MOSFET 50, e.g., in the range of about 2000 nm, but other distances can also be used. Nwell region 54 is conveniently formed by ion implantation, although this is not essential. Lateral edges 54-1 and 54-2 of Nwell region 54 are terminated by surrounding oxide trenches 58-2, 58-5 (abbreviated as "OT"). Other oxide trenches (OTs) 58-1, 58-3, 58-4, 58-6 are provided to laterally isolate other device regions. Oxide trenches 58-1 . . . 58-6 are collectively referred to as oxide trenches 58 and are conveniently formed by etch and refill before or after formation of Nwell region 54, however, this is not essential and other isolation fabrication techniques can also be used. N+ regions 60-1, 60-2 (collectively "60") with metal contacts 62-1, 62-2 (collectively "62") of, e.g., TiSi or CoSi, are provided to make electrical connections 63-1, 63-2 (collectively 63) to Nwell region 54. Pwell-I regions 64-1, 64-2 (collectively 64) and P+ regions 66-1. 66-2 (collectively 66) with metal contacts 68-1, 68-2 (collectively 68) of, for example, Ti or Co Silicide are provided to make electrical connections 69-1, 69-2 (collectively 69) to P-substrate 52. Oxide trenches (OTs) 58-2 and 58-5 isolate P+ regions 66-1, 66-2 from N+ regions 60-1, 60-2, respectively. Oxide trenches (OTs) 58-1, 58-2 provide isolation with respect to other circuit elements (not shown) that are outside the lateral boundaries of device 50.

P+ source region 70 is provided in Nwell region 54, laterally separated from N+ region 60-1 by oxide trench 58-3. More lightly doped PLds region 74 is provided below and around P+ source region 70. Source contact 72 of, for example, Ti or Co Silicide is provided on source region 70 to make electrical contact thereto and provide source connection 73. P+ drain region 76 is provided in Nwell region 54. More lightly doped PLdd region 80 is provided below and around P+ drain region 76. Drain contact 78 of, for example, Ti or Co Silicide is provided on P+ drain region 76 to make electric contact thereto and provide drain connection 79. Lightly doped PLds region 74 and PLdd region 80 are conveniently provided by ion implantation at the same time. P+ source region 70 and P+ drain region 76 are conveniently provided by ion implantation at the same time. PLds, PLdd regions 74, 80 and P+ source/drain regions 70, 76 may be provided in either order, but PLds and PLdd 74, 80 regions are conveniently implanted prior to P+ regions 66, 70, 76 and N+ regions 60, but this is not essential.

Gate dielectric 82 (e.g., silicon dioxide) surmounted by gate 84 (e.g., doped polysilicon) of length Lg is formed on upper surface 56 above Nwell region 54. Gate contract 86 of, for example, Ti or Co Silicide is provided to make electrical contact to gate 84 and provide gate connection 87. Conventional lateral spacers 88 of, for example silicon nitride, are provided on the lateral faces of gate 84. Blocking layer 89 is provided on upper surface 56 between gate 84 and P+ drain region 76 and between P+ drain region 76 and OT 58-4 to block the underlying portions of upper surface 56 during formation of source, drain and gate contacts 72, 78, 86, etc., but any means of preventing unwanted surface shorting can also be used. Channel region 90 of length Lch is located in Nwell region 54 underlying the left portion of gate 84 and gate dielectric 82, between PLds region 74 and Pwell-II region 92. Pwell-II region 92 extends from just under gate 84 to PLdd region 80 adjacent drain region 76, to make contact with the inverted channel region. Pwell-II region 92 provides a drift space useful in combination with buried region Pwell-III region 96 in achieving a high breakdown voltage and is desirably less heavily doped then PLdd region 80 (and PLds region 74). Pwell-II region 92 conveniently but not essentially extends laterally past drain region 76 and is terminated by oxide trench (OT) 58-4 (as shown for example by region 92A in FIG. 4).

Pwell-III region 96, which underlies Pwell-II region 92, is of approximately the same lateral dimensions as Pwell-II region 92 and is separated in depth below upper surface 56 from Pwell-II region 92 by gap 94 of width 95. Pwell-III region 96 is also desirably laterally terminated on the far side of P+ drain region 76 by OT 58-4. PLdd region 80 beneath P+ drain region 76 couples Pwell-III region 96 and P+ drain region 76, so that current may ohmically flow from Pwell-III region 96 to P+ drain region 76.

The semiconductor material in gap 94 is a part of Nwell region 54. Thus, Pwell-II region 92, gap 94 (formed in the material of Nwell region 54) and PWell-III region 96 form a p-n-p and/or p-i-p device with a very narrow and generally depleted, base region of width 95. It is important that width 95 of gap 94 between Pwell-II region 92 and Pwell-III region 96 be such that significant, non-linear, high field conduction can occur across gap 94 as the source-drain voltage is increased and source-drain current flows through Pwell-II region 92. As used herein, the term high field conduction is intended to include Fowler-Nordheim tunneling, Poole-Frenkel emission, avalanche conduction, space charge limited current flow, ballistic transport, punch through and other high electric field conduction mechanisms that exhibit very non-linear, preferably exponential, current-voltage characteristic. It is believed that a principal mechanism is punch-through but other conduction mechanisms may also occur. For convenience of description these various phenomena are collectively referred to by the term "high field conduction." Also, source region 70, drain region 76, Pwell-II region 92 and Pwell-III region 96 are also variously referred to as "device regions", as for example, "first" device region, "second" device region, etc.

Figure 2:
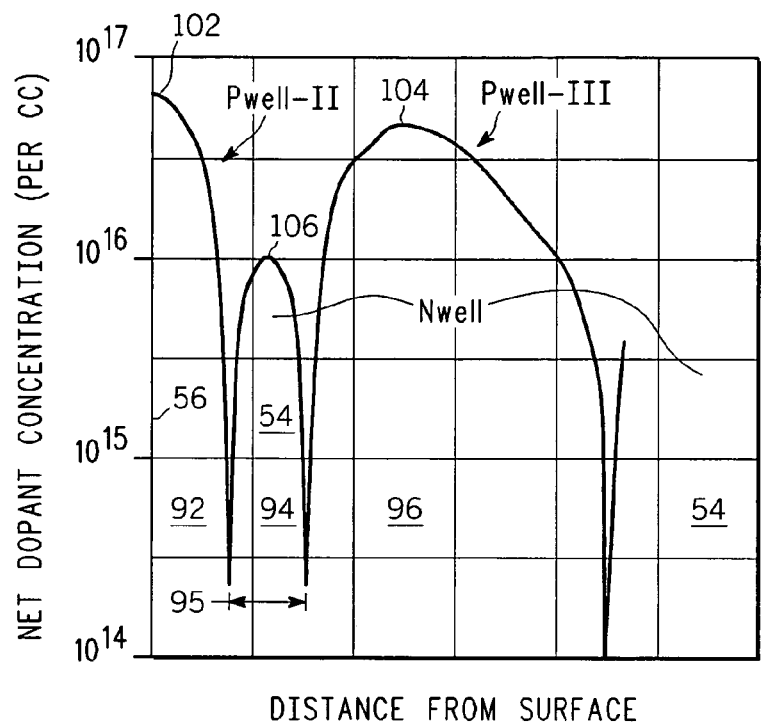
FIG. 2 is a simplified plot of the net doping density as a function of distance from the surface for the MOSFET of FIG. 1, in the location indicated in FIG. 1.

FIG. 2 shows simplified plot 100 of the net doping density per cubic centimeter as a function of the distance from upper surface 56 of substrate 52 of MOSFET 50 of FIG. 1, at location 2—2 indicated in FIG. 1. Pwell-II region 92 has peak 102 concentration at upper surface 56 slightly larger than peak concentration 104 of Pwell-III region 96. Peak concentration 104 of Pwell-III region 96 is usefully 2–10 times that of peak concentration 106 within gap 94 in Nwell region 54, more conveniently 4–6 times and preferably about 5 times. Pwell-II region 92 and Pwell-III region 96 are conveniently formed by ion implantation to individual doses on the order of 1E12-1E13/sq cm net. The implant energy is different for Pwell-II region 92 and Pwell-III region 96 so as to produce the difference in depth from upper surface 56 and gap 94 between the two implants.

Figure 3:
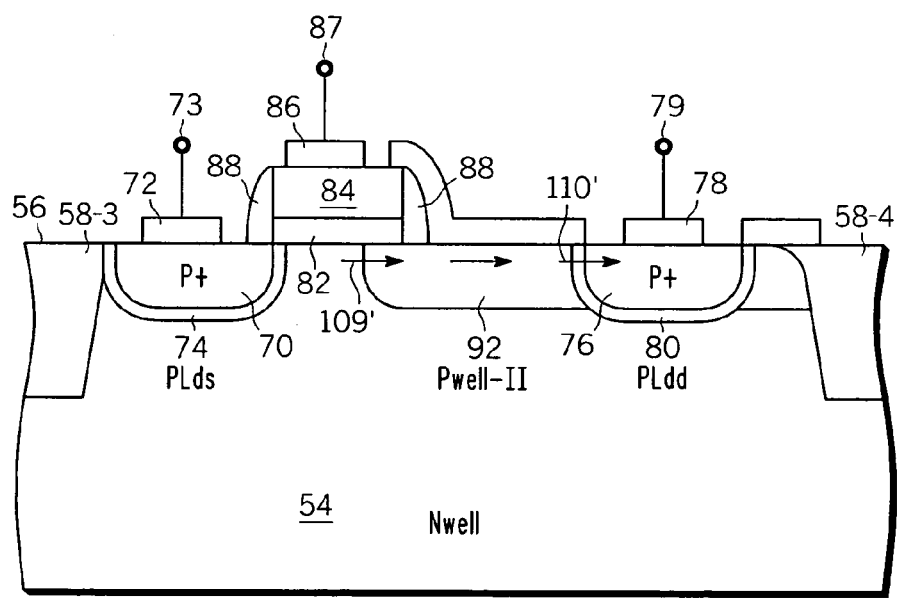
FIGS. 3 and 4 are simplified cross-sectional views of a portion of the MOSFET of FIG. 1, somewhat enlarged and illustrating how the structure of the MOSFET of FIG. 1 redirects current flow within the device so as to achieve higher breakdown voltages.
Figure 4:
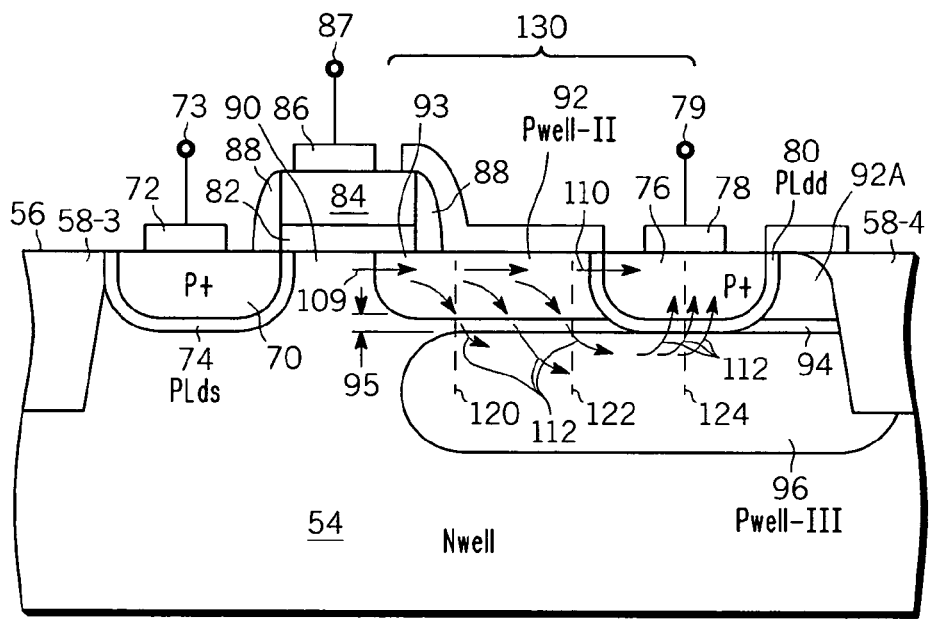

FIGS. 3 and 4 are simplified cross-sectional views of portions 99', 99 respectively, of MOSFET 50 of FIG. 1, somewhat enlarged and illustrating how the structure of MOSFET 50 of FIG. 1 redirects current flow 109, 110, 112 within the device so as to improve breakdown voltages. In portion 99' of FIG. 3, Pwell-III region 96 is omitted. Referring now to FIG. 3, as the source-drain voltage is increased, breakdown current 109', 110' will eventually begin to flow through the drift space provided by Pwell-II region 92. Breakdown current 110' tends to concentrate near upper surface 56 resulting in rapid rise in impact ionization in the near surface portions of Pwell-II region 92, especially near drain region 76.

Referring now to FIG. 4, which includes Pwell-III region 96, the presence of Pwell-III region 96 separated from Pwell-II region 92 by narrow gap 94 permits source-drain current 109 to divide into two parts; near-surface current portion 110 close to upper surface 56 (e.g., along a path similar to current 110' in the device of FIG. 3) and sub-surface current portion 112 (e.g., a high field conduction current) that flows across gap 94 and through Pwell-III region 96 and PLdd region 80 to P+ drain region 76. For the same total source-drain current 109' of FIG. 3 and 109 of FIG. 4, near surface current portion 110 of FIG. 4 is much less than breakdown current 110' of FIG. 3. Run-away current increase in that near surface region is retarded and does not occur until substantially larger source-drain voltages. Accordingly, other things being equal, the breakdown voltage of MOSFET 50 is significantly increased (e.g., from 14 volts to 60 volts) compared to otherwise identical devices without the combination of Pwell-II 92 plus Pwell-III 96 separated from Pwell-II 92 by narrow gap 94 and ohmically coupled to drain region 76.

The bifurcation of source-drain current 109 into near-current portion 110 and sub-surface current portion 112 is believed to occur in the following way. As the source-drain voltage is raised, near surface current portion 110 begins to flow laterally through Pwell-II region 92. Because of the finite sheet resistance of Pwell-II region 92 (e.g., about 400–800 Ohms per square), the potential at locations 120, 122 in Pwell-II region 92 will differ from the potential at location 124 in Pwell-II region 92. Pwell-III region 96 as yet has no significant current flow and is electrically coupled to Pwell-II region 92 at location 124 by PLdd region 80. Hence the electrical potential at locations 120, 122 in Pwell-III region 96 will be the same as the potential of Pwell-II region 92 at location 124. Thus, a potential difference will exist across gap 94 between Pwell-II 92 and Pwell-III 96 at locations 120, 122 (and all other locations between them up to PLdd region 80). By making width 95 of gap 94 small enough, sub-surface current portion 112 can flow by, for example, high field conduction from Pwell-II region 92 to Pwell-III region 96 across gap 94. High field conduction, whether by tunneling, punch through or other mechanisms, has very non-linear current-voltage characteristics. Thus, as the source-drain voltage increases, sub-surface current 112 can increase very rapidly relative to surface current portion 110 and can become a significant fraction of total source-drain current flow. This has the effect of forcing an increasing share of the source-drain current to flow away from upper surface 56. With the present invention, only a mask change to define an implant for Pwell-III region 96 and PLdd region 80 is needed although use of additional process steps is not precluded. Thus, no change in the manufacturing process is required to obtain the benefits of the present invention. While PLdd region 80 is conveniently used to ohmically couple Pwell-III region 96 to drain region 76, this is not essential, and any form of ohmic connection can be employed. For example, and not intended to be limiting, a surface accessible ohmic contact may be provided to Pwell-III region 96 and connected to drain region 76 by a metal layer or other ohmic connection on or above surface 56.

Figure 5:
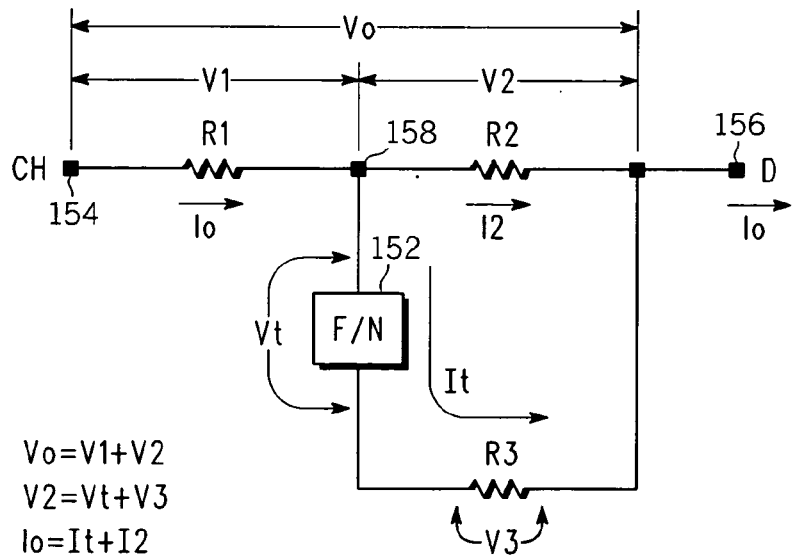
FIG. 5 shows a simplified, schematic, lumped element electrical equivalent circuit of an output portion of the device of FIG. 4 involving a high field conduction element coupled to the drain, according to the present invention.

FIG. 5 shows a highly simplified, schematic, lumped element, electrical equivalent circuit 150 of output portion 130 of the device of FIG. 4 that includes high-field conduction element 152 according to the present invention. Persons of skill in the art will understand that equivalent circuit 150 provides only an approximate (lumped element) representation of the distributed structure of output portion 130, and is not intended to accurately model all of the conduction effects occurring in device 50 of the present invention. But as will be shown it is sufficient to demonstrate how high field conduction between Pwell-II region 92 and Pwell-III region 96 can divert current away from surface 56 and thereby contribute at least in part to the breakdown voltage of MOSFET 50. Input 154 is analogous to channel region 90 of MOSFETs 50 and 99, and output 156 is analogous to P+ drain region 76 of FIGS. 1 and 4. Current injected into device 50 via source region 70 passes through channel region 90 and drift space Pwell-II region 92 and is extracted via drain region 76. Resistor R1 coupled between input 154 and node 158 represents the sheet resistance of whatever portion of Pwell-II region 92 precedes location 120 where gap 94 has narrowed to distance 95 sufficient to permit significant high field conduction. Resistance R2 coupled from node 158 to output 156 represents the sheet resistance of the portion of Pwell-II region 92 approximately between boundary 120 and P+ drain region 76. In the simple lumped element equivalent circuit of FIG. 5, all of the high field conduction is assumed to take place at about boundary 120 where the electric field between Pwell-II region 92 and Pwell-III region 96 will likely have its maximum. For simplicity, high field conduction element 152 is assumed to be a Fowler-Nordheim (F/N) tunneling element and it and resistance R3 are series coupled from node 158 to output 156. Resistance R3 represents the sheet resistance of Pwell-III region 96 between boundary 120 and P+ drain region 76.

The current-voltage properties of high field conduction (e.g., tunneling) element 152 for a triangular potential barrier can be approximated by:

$$J = C1 * E^2 * \mathrm{Exp}(-C2/E), \qquad [1]$$

where J is the current density, E is the electric field, and C1 and C2 are constants determined by the barrier height, the electron charge, Plank's Constant and other parameters. For convenience, we assume that E=V/d where V is the voltage applied to F/N tunneling element 152 and d is the gap width across which tunneling is to take place, e.g., gap 94. With this substitution, Eq. [1] becomes:

$$I = K1 * V^2 * \mathrm{Exp}(-K2/V), \qquad [2]$$

where I is the current and the constants K1, K2 now include the gap width. The relative conduction areas needed to convert from current density J to current I are assumed to have a fixed relationship which is incorporated in constant K1.

Combining Eq. [2] with conventional circuit analysis yields equations for the currents and voltages illustrated on FIG. 5 that can be solved numerically, where Io is the total current from input 154 to output 156 (which also flows through R1), I2 is the portion of Io that flows through R2, and It is the portion of Io that flows through high field conduction element 152 and R3. It was assumed in evaluating equivalent circuit 150 that R1:R2:R3 had relative sizes of 1:10:5 (corresponding to the relative sheet resistances of the different regions they represent) and that K1:K2 had relative sizes of 0.1:5. K1 and K2 were chosen merely for convenience of computation using Vo values of about 0–100 and are not intended to represent an actual physical structure but merely demonstrate that the present invention can produce an increase in expected breakdown voltage as compared to a similar device without the combination of Pwell-II region 92 and Pwell-III region 96 arranged as described herein.

Figure 6:
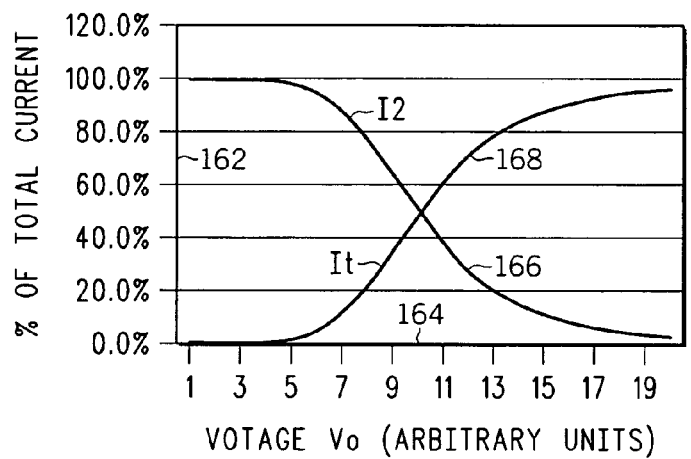
FIG. 6 shows a simplified graph based on the equivalent circuit of FIG. 5 illustrating how the present invention alters the drain current paths with increasing drain voltage.

FIG. 6 shows simplified graph 160 based on equivalent circuit 150 of FIG. 5 illustrating how the present invention alters the drain current paths with increasing drain voltage, wherein Io is the total drain current, I2 is the portion flowing through R2 (analogous to current 110 of FIG. 4), and It is the high field conduction current flowing through F/N element 152 and R3 (analogous to currents 112 of FIG. 4). Ordinate 162 shows the percentage of current Io, abscissa 164 shows a quantity proportional to the applied voltage Vo, trace 166 corresponds to I2, and trace 168 corresponds to It. It will be noted that at low voltage essentially all of the current flows through R2, and none flows through high filed conduction element 152 and R3. As the (source-drain) voltage Vo increases, the high field conduction current rises very rapidly and there is a corresponding decrease in the current through R2. This shows that incorporation of the high field conduction path provided by Pwell-III region 96 in close proximity to Pwell-II 92 with narrow gap 94 can divert a significant portion of the source-drain breakdown current away from upper surface 56. As explained earlier, this is expected to contribute to an increase in BVdss. The device structures described herein, according to the present invention, provided a 187% improvement in BVdss due to the presence of Pwell-III region 96 underlying and in close proximity to Pwell-II region 92 and ohmically coupled to drain region 76.

For convenience of explanation, the present invention has been described in terms of P-channel MOSFETS. However, people of skill in the art will understand based on the description herein that it applies equally well to N-channel MOSFETS and to other semiconductor devices where surface current and field crowding adversely impacts the breakdown voltage. Accordingly, it is intended that: (i) those regions identified herein as "P" type also include regions of "a first conductivity type (either N or P)", and (ii) that those regions identified herein as "N" type also include "regions of a second conductivity type (either P or N) different than the first conductivity type." It is also intended that the term "MOSFET" include any type of semiconductor device where surface currents and fields have a significant impact on breakdown voltage and that the terms "source" and "drain" and "Pwell" and "Nwell" include more general designations such as for example and not intended to be limiting, "first region", "second region", third region, and so forth.

Figure 7:
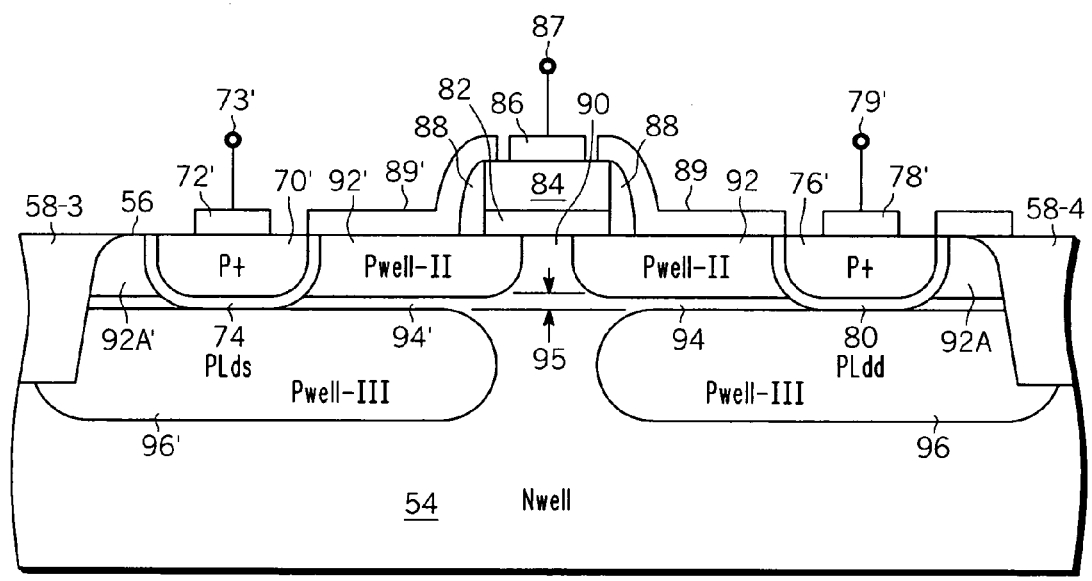
FIG. 7 is a simplified cross-sectional view generally similar to FIG. 4 but of a MOSFET according to a further embodiment of the present invention.

FIG. 7 is a simplified cross-sectional view generally similar to FIG. 4 but of MOSFET 199 according to a further embodiment of the present invention. The same reference numbers have been used to identify like regions. While FIGS. 1 and 4 illustrate substantially uni-directional MOSFETS where current flows generally only from source 70 to drain 76, FIG. 7 illustrates a more symmetrical and substantially bi-directional device wherein either of regions 70', 76' can function as the source and the other as the drain. In MOSFET 199, Pwell-II region 92' is desirably provided between "source" region 70' and gate 84 and Pwell-II region 92 between gate 84 and "drain" region 76'. Similarly, Pwell-III region 96' underlies Pwell region 92' in substantially the same arrangement as Pwell-III region 96 underlies Pwell region 92. Thus, the increased breakdown voltage capabilities of the present invention can be applied to bi-directional as well as substantially uni-directional MOSFETS. It is convenient to form Pwell regions 92, 92' simultaneously and to form Pwell-III regions 96, 96' simultaneously, although that is not essential. Similarly, gaps 94, 94' are shown in FIG. 7 as having the same width 95, but this is not essential, and different gap widths can be used for the source and drain sides of the device.

In a first exemplary embodiment, there is provided a MOSFET having a first surface and comprising: a source region of a first conductivity type at the first surface, a drain region of the first conductivity type, spaced apart from the source region at the first surface, a channel region of a second conductivity type opposite the first conductivity type, located between the source and drain regions at the first surface, a first drift space of the first conductivity type coupling the channel region and the drain region at the first surface, a first buried region of the first conductivity type beneath and separated from the first drift space by a narrow gap of the second conductivity type, wherein the buried region is ohmically coupled to the drain region. In a preferred arrangement the MOPSFET further comprises: a second drift space of the first conductivity type located between the source region and the channel region, and a second buried region of the first conductivity type beneath and separated from the second drift space by a narrow gap of the second conductivity type, wherein the second buried region is ohmically coupled to the source region. In a still further embodiment, the MOSFET further comprises a first isolation region laterally separated from the drain region, and wherein the first drift space extends laterally beyond the drain region and intersects the first isolation region. In a yet further embodiment, the MOSFET the first buried region extends laterally beyond the drain region and intersects the first isolation region. In a still further embodiment the first buried region is ohmically coupled to the drain region by a sub-surface region of the same conductivity type as the first buried region and the drain region. A yet still further embodiment comprises a region of the second conductivity type underlying the source and drain regions and the buried region, and wherein the narrow gap and the channel region are part of the further region.

In another exemplary embodiment, there is provided a method for forming a MOSFET comprising: providing a substrate of a first conductivity type, then in any order, forming a region of a second conductivity type opposite the first conductivity type overlying at least a portion of the substrate, providing spaced-apart source and drain regions of the first conductivity type and having a channel region of opposite conductivity type therebetween located in the region of the second conductivity type, forming a drift space of the same conductivity type as the source or drain region coupled to the source or drain region and extending toward the channel region, forming a buried region of the same conductivity type as the drift space, coupled at one end to the source or drain region and underlying the drift space and separated in depth therefrom by a gap sufficiently narrow to permit significant high field conduction current to flow to or from the drift space to the buried region in response to source-drain current flow through the drift space, and wherein the source, drain and channel regions and the drift space extend to a first surface of the region of the second conductivity type. In a still further embodiment, the forming steps comprise: ion implanting the region of the second conductivity type, ion implanting the drift space, and ion implanting the buried region. In a yet further embodiment, the steps of forming the drift space and forming the buried region comprise: forming the drift space adjacent the drain region, and forming the buried region adjacent the drain region. In a yet still further embodiment the steps of forming the drift space and forming the buried region comprise, forming the drift space adjacent the source region, and forming the buried region adjacent the source region. In an additional embodiment, the steps of forming the drift space and forming the buried regions comprise, forming drift spaces adjacent both the source and drain regions, and forming buried regions adjacent both the source and drain region. In a still additional embodiment the method comprises: forming a further buried region of the same conductivity type as the source or drain region ohmically coupling the source or drain region respectively to the buried region or regions underlying the source or drain region.

According to a further embodiment of the present invention there is provided a semiconductor device having a surface, comprising: a first device region extending to the surface, configured to inject current into the device, a second device region extending to the surface and spaced apart from the first device region at the surface, configured whereby current injected at the first device region flows at least in part near the surface to the second device region and is extracted from the semiconductor device via the second device region, a third device region of the same conductivity type as the second device region, ohmically coupled to the first or second device region and located between the first and second device regions, a fourth device region of the same conductivity type as the first or second device region, located beneath the third device region and electrically spaced apart therefrom in depth by a narrow gap configured to provide highly non-linear conduction between the third and fourth device regions as current flow from the first to the second device regions through the third device region increases, wherein the fourth device regions is configured to divert a significant portion of the current flow between the first and second device regions through the fourth device region by means of said highly non-linear conduction through the narrow gap. Another implementation further comprises a fifth device region located beneath the first or second device region for ohmically coupling the fourth device region thereto. A still further exemplary implementation comprises a lateral isolation wall spaced apart from the first or second device regions, wherein the third device region laterally terminates on the isolation region. And in a yet further implementation the fourth device region laterally terminates on the isolation region. In a still further implementation the third and fourth device regions are adjacent one of the first or second device regions. In a still further implementation the third and fourth device regions are adjacent both of the first or second device regions. In a still yet further implementation the highly non-linear conduction comprises exponentially rising conduction. In a yet still additional implementation the first device region is a source region, the second device region is a drain region, the third device region is a drift space between the source-drain regions and the fourth device region is a buried region underlying the drift space.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a MOSFET comprising:
   providing a substrate of a first conductivity type;
   then in any order:
      forming a region of a second conductivity type opposite the first conductivity type overlying at least a portion of the substrate;
      providing spaced-apart source and drain regions of the first conductivity type and having a channel region of opposite conductivity type therebetween located in the region of the second conductivity type;
      forming a drift space of the same conductivity type as the source or drain region coupled to the source or drain region and extending toward the channel region;
      forming a buried region of the same conductivity type as the drift space, coupled at one end to the source or drain region and underlying the drift space and separated in depth therefrom by a gap sufficiently narrow to permit significant high field conduction current to flow to or from the drift space to the buried region in response to source-drain current flow through the drift space; and
      wherein the source, drain and channel regions and the drift space extend to a first surface of the region of the second conductivity type.

2. The method of claim 1 wherein the forming steps comprise:
   ion implanting the region of the second conductivity type;
   ion implanting the drift space; and
   ion implanting the buried region.

3. The method of claim 1 wherein the steps of forming the drift space and forming the buried region comprise:
   forming the drift space adjacent the drain region; and
   forming the buried region adjacent the drain region.

4. The method of claim 1 wherein the steps of forming the drift space and forming the buried region comprise:
   forming the drift space adjacent the source region; and
   forming the buried region adjacent the source region.

5. The method of claim 1 wherein the steps of forming the drift space and forming the buried regions comprise:
   forming drift spaces adjacent both the source and drain regions; and
   forming buried regions adjacent both the source and drain region.

6. The method of claim 1 further comprising:
   forming a further buried region of the same conductivity type as the source or drain region ohmically coupling the source or drain region respectively to the buried region or regions underlying the source or drain region.

* * * * *